(12) United States Patent
Mizuno et al.

(10) Patent No.: US 8,129,903 B2
(45) Date of Patent: Mar. 6, 2012

(54) ORGANIC ELECTROLUMINESCENT DISPLAY DEVICE

(75) Inventors: Yukitami Mizuno, Tokyo (JP); Shintaro Enomoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 218 days.

(21) Appl. No.: 12/212,074

(22) Filed: Sep. 17, 2008

(65) Prior Publication Data

US 2009/0243484 A1  Oct. 1, 2009

(30) Foreign Application Priority Data

Mar. 26, 2008  (JP) .................................. 2008-081018

(51) Int. Cl.
*H01L 51/50* (2006.01)
(52) U.S. Cl. ...................................................... 313/512
(58) Field of Classification Search .................. 313/504, 313/512
See application file for complete search history.

(56) References Cited

U.S. PATENT DOCUMENTS

| 6,897,608 | B2* | 5/2005 | Yamazaki et al. | 313/506 |
| 2005/0156513 | A1* | 7/2005 | Sano et al. | 313/504 |
| 2006/0199461 | A1* | 9/2006 | Yamazaki et al. | 445/24 |

FOREIGN PATENT DOCUMENTS

| JP | 2776040 | 5/1998 |
| JP | 2006-114405 | 4/2006 |

* cited by examiner

*Primary Examiner* — Toan Ton
*Assistant Examiner* — Hana Featherly
(74) *Attorney, Agent, or Firm* — Oblon, Spivak, McClelland, Maier & Neustadt, L.L.P.

(57) ABSTRACT

An organic electroluminescent display device is provided, which includes a substrate having anodes arranged thereon, a bank which defines a luminous region on the anode, an organic emitting layer formed in the luminous region, and a cathode formed on the bank and the emitting layer. A desiccant layer selectively formed on the bank with interposition of the cathode.

9 Claims, 4 Drawing Sheets

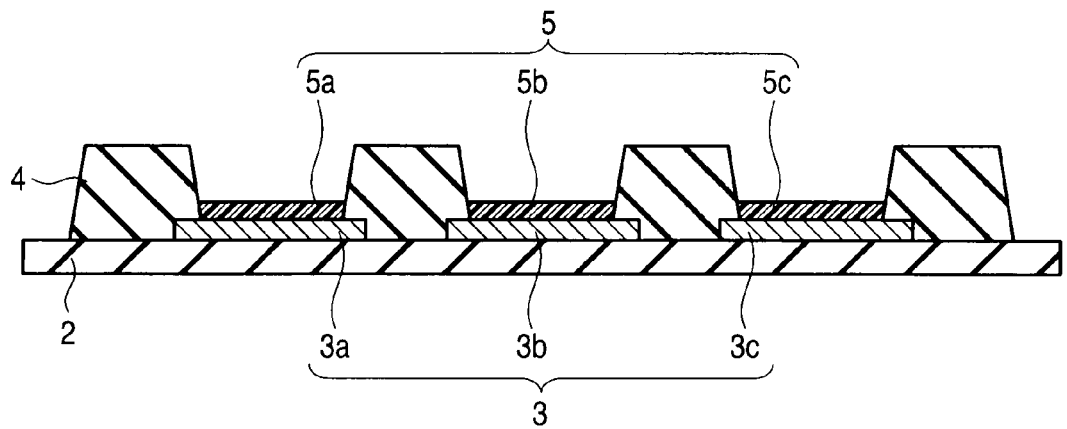
F I G. 4
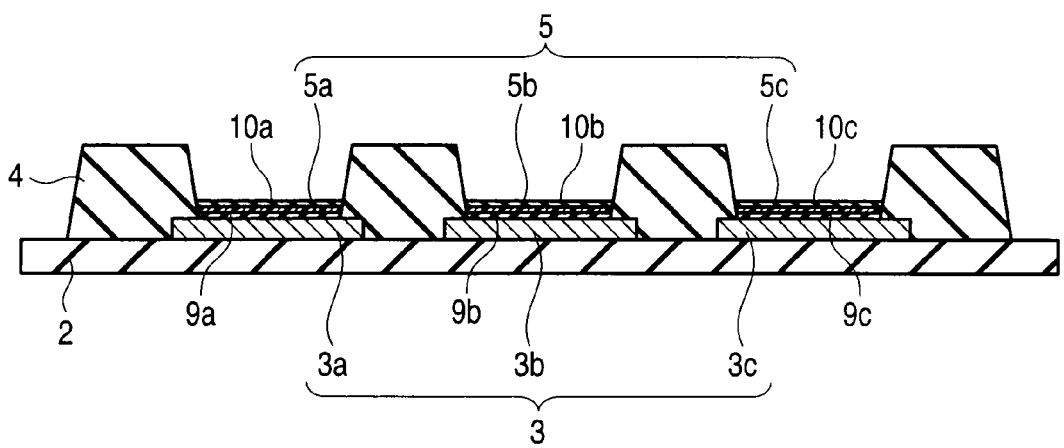
F I G. 5
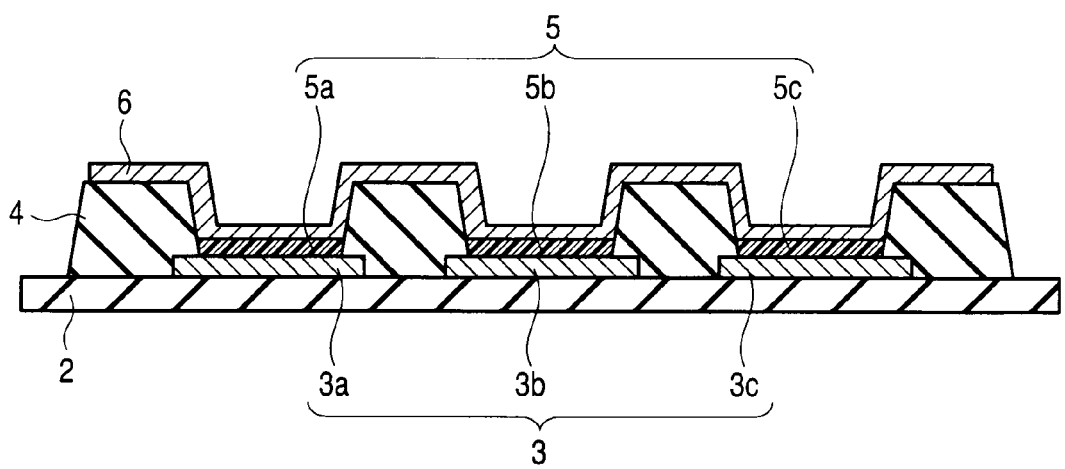
F I G. 6

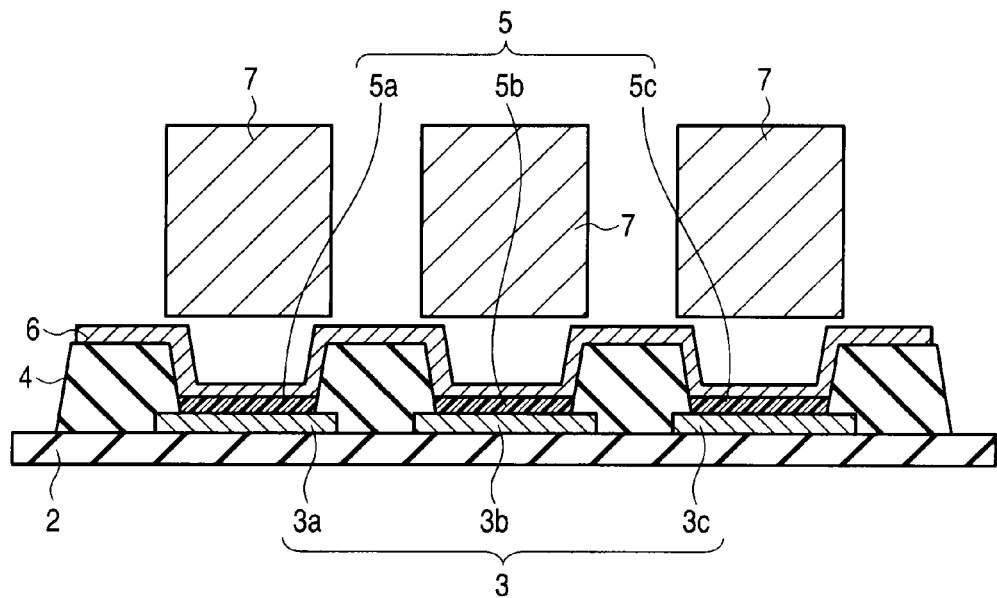
F I G. 7
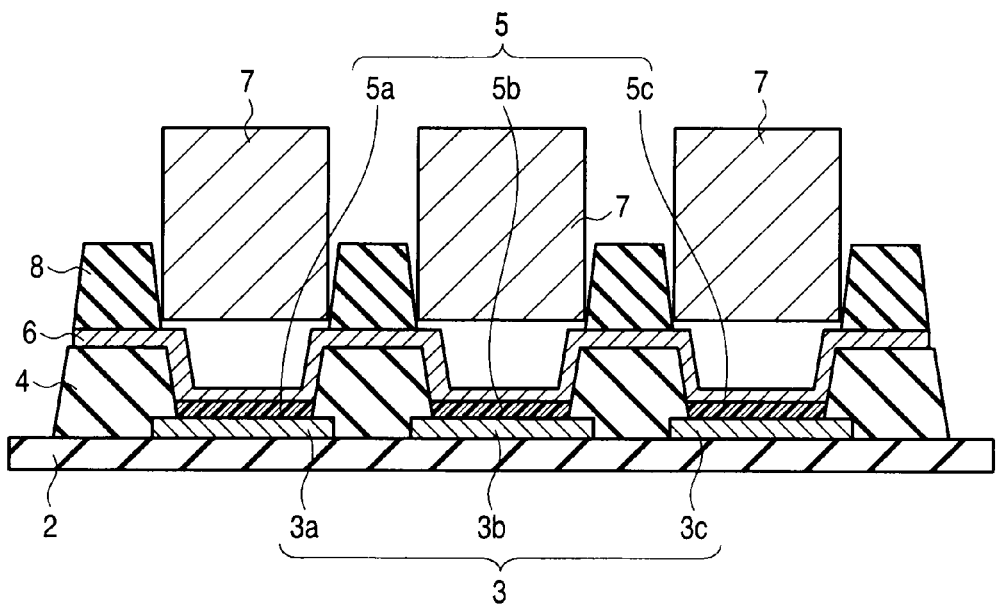
F I G. 8

ORGANIC ELECTROLUMINESCENT DISPLAY DEVICE

CROSS-REFERENCE TO RELATED APPLICATIONS

This application is based upon and claims the benefit of priority from prior Japanese Patent Application No. 2008-081018, filed Mar. 26, 2008, the entire contents of which are incorporated herein by reference.

BACKGROUND OF THE INVENTION

1. Field of the Invention

The present invention relates to a display device containing a emitting layer that exhibits the electroluminescence (EL) phenomenon, and a method for manufacturing the display device.

2. Description of the Related Art

Light sources taking advantage of the EL phenomenon have been studied and developed for the purpose of wide range of applications in an illumination device and a backlight of a display as well as for luminescent devices such as luminescent pixels of a display.

The luminous characteristics of the organic EL display device are degraded by oxygen and water. Various methods have been proposed for maintaining the inside of the display device in a dry atmosphere.

One method is to cover the element with a sealing substrate, and to dispose a desiccant on the inner surface of the sealing substrate. However, it is necessary to secure a sufficient space on the inner surface of the substrate in order to dispose the desiccant in a sufficient amount enough for absorbing oxygen and water invading from the outside. In addition, manufacture of the sealing substrate requires cost and time such that a storage space of the desiccant is provided at a part of the sealing substrate. Further, the surface becomes rough due to the desiccant, which may be peeled anywhere. This may cause defective elements by direct contact of the desiccant with the organic EL element.

JP-A 2006-114405 (KOKAI) proposes a method for disposing a desiccant layer around the luminous region on the substrate within the element. However, this is the method not desirable for the display since a region other than the luminous region is added. Oxygen and water having passed through the region in which the desiccant layer is disposed arrive at the luminous region.

Japanese Patent No. 2776040 proposes a method for forming a sealing layer containing the desiccant on the surface of a cathode. Transmittance of the sealing layer decreases by allowing the sealing layer to contain a sufficient amount of the desiccant when the organic EL display device emits the light from the cathode side. Consequently, light emission efficiency of the organic EL display device decreases while electric power consumption increases due to the decrease in luminous efficiency.

BRIEF SUMMARY OF THE INVENTION

An organic electroluminescent display device according to one aspect of the present invention comprises:
a substrate having anodes arranged thereon;
a bank which defines a luminous region on the anode;
an organic emitting layer formed in the luminous region;
a cathode formed on the bank and the emitting layer; and
a desiccant layer selectively formed on the bank with interposition of the cathode.

A method for manufacturing an organic electroluminescent display device according to another aspect of the present invention comprises:
forming patterned anodes above a substrate;
forming a bank which defines a luminous region on the anode;
forming an organic emitting layer in the luminous region;
forming a cathode on the bank and the emitting layer; and
protecting the emitting layer with a mask to selectively form a desiccant layer on the bank having the cathode formed thereon.

BRIEF DESCRIPTION OF THE SEVERAL VIEWS OF THE DRAWING

FIG. 4 is a cross-sectional view showing an example of the step subsequent to FIG. 3;

FIG. 5 is a cross-sectional view showing another example of the step subsequent to FIG. 3;

FIG. 6 is a cross-sectional view showing the step subsequent to FIG. 4;

FIG. 7 is a cross-sectional view of the step subsequent to FIG. 6;

FIG. 8 is a cross-sectional view of the step subsequent to FIG. 7;

DETAILED DESCRIPTION OF THE INVENTION

An embodiment will be described below with reference to the drawings.

Figure 1:
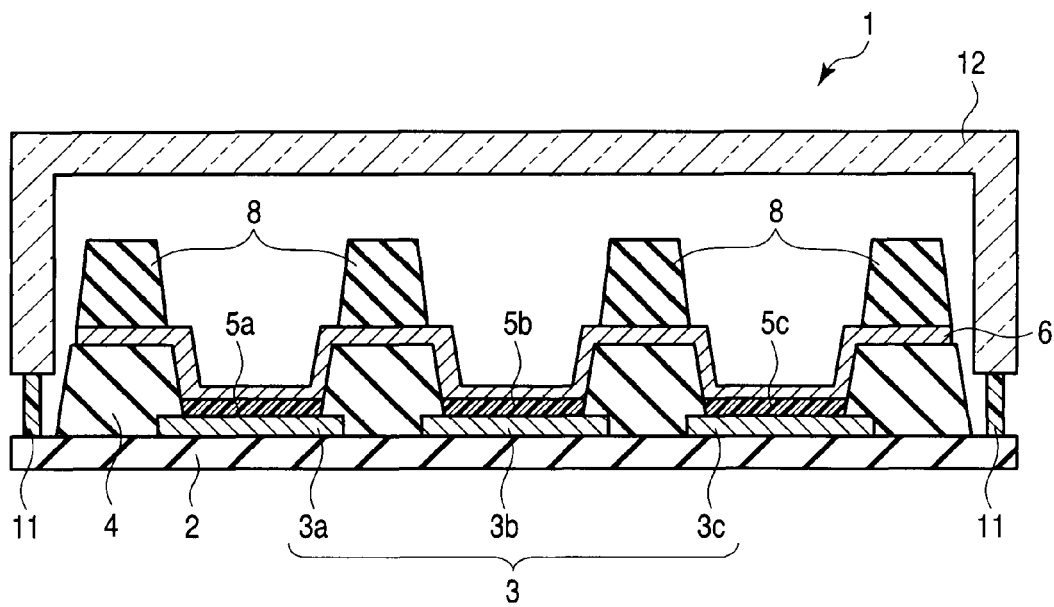
FIG. 1 is a cross-sectional view of an organic EL device according to an embodiment.

In an organic EL display device 1 shown in FIG. 1, a patterned anode 3 is formed on a substrate 2. The anode 3 includes a first anode 3a, a second anode 3b and a third anode 3c. A bank 4 is provided so as to isolate adjoining anode, and electrode surfaces exposed for every pixel are defined. The bank 4 also act to define the shape of the pixel.

A first emitting layer 5a is formed on the first anode 3a. A second emitting layer 5b is formed on the second anode 3b, and a third emitting layer 5c is formed on the third anode 3c. The organic EL display device of the embodiment is not limited to this structure. For example, a fourth emitting layer may be formed on the fourth anode (not shown). A cathode 6 is formed on the bank 4 and emitting layer 5.

A desiccant layer 8 is selectively formed on the bank 4 on which the cathode 6 is formed. The desiccant layer 8 contains at least one selected from the group consisting of alkali metals, alkali earth metals and alloys thereof. Specifically, the desiccant layer 8 contains, as a desiccant element, at least one selected from the group consisting of lithium, sodium, magnesium, potassium, calcium, rubidium, cesium, strontium and barium.

The organic EL display device 1 of such structure is constructed by being covered with a sealing substrate 12 bonded to the substrate 2 with a sealing section 11.

The organic EL display device according to the embodiment can be manufactured as follows.

Figure 2:
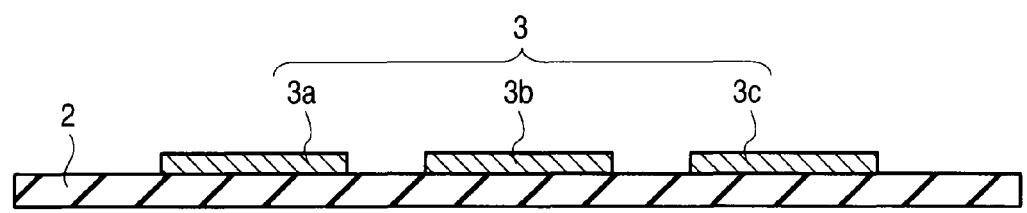
FIG. 2 is a cross-sectional view showing a manufacturing step of the organic EL device according to the embodiment.

First, the anodes 3a, 3b and 3c are formed on the substrate 2 as shown in FIG. 2. The substrate 2 may be composed of any materials having a sufficient strength in the steps for forming the anode and the organic EL display device.

When the anode 3 is formed by sputtering and vacuum deposition, the substrate 2 is desirably made of a material that causes no deformation at a temperature exceeding 200° C. Examples of the material include glass, quartz and silicon.

When a transparent substrate such as glass and quartz is used, it is possible to emit the light from the substrate side. On the other hand, an opaque substrate such as silicon has an advantage that the strength of the substrate may be enhanced by using various additives.

When the anode 3 is formed at an ambient temperature by, for example, transcription or printing, a plastic substrate may be used as the substrate 2. Examples of the plastic include polyethylene terephthalate, polyetherimide, polyetherether ketone, polyether sulfone, polyethylene naphthalate, polyimide, polyphenylene sulfide, polyethylene and polycarbonate.

Any conductive materials may be used for the anode 3.

Examples of metal oxide semiconductors include oxides of transition metals and perovskites. Examples of the transition metal include titanium, zirconium, hafnium, strontium, zinc, tin, indium, yttrium, lanthanum, vanadium, niobium, tantalum, chromium, molybdenum and tungsten. Examples of the perovskite include $SrTiO_3$, $CaTiO_3$, $BaTiO_3$, $MgTiO_3$ and $SrNb_2O_6$. Alternatively, these composite oxides or mixtures of oxides and GaN may be used as metal oxide semiconductors. The anode 3 may be formed using aluminum or silver.

The anode 3 formed by any of the above-mentioned materials desirably has a thickness of 50 nm or more. Electric conductivity may be decreased when the thickness of the anode 3 is as thin as less than 50 nm. When the anode is too thick, on the other hand, the time required for forming the electrode is elongated to make it difficult to shorten the manufacturing step. The thickness of the anode is desirably 1000 nm or less.

Figure 3:
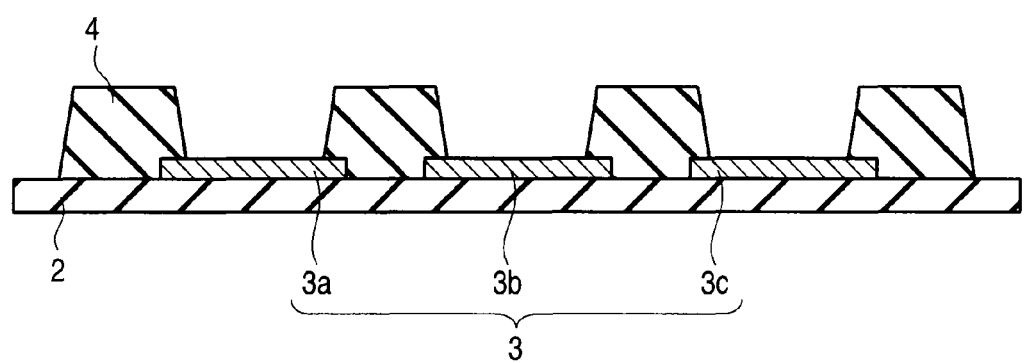
FIG. 3 is a cross-sectional view showing the step subsequent to FIG. 2.

The bank 4 is formed as shown in FIG. 3 on the substrate 2 on which the anodes 3a, 3b and 3c are formed. The bank 4 is formed for defining the luminous region on the anodes 3. The bank 4 is also effective for forming a emitting layer on the anode. For example, since there is no level difference at the end of the anode, a defective layer may be avoided from being deposited on the emitting layer. When the emitting layer is formed by applying a solution, the solution may be prevented from invading on another anode.

Examples of the material of the bank 4 include insulative polymer materials such as acrylic resin and polyimide, and insulative oxide such as silicon oxide. A layer containing these materials is formed on the entire surface of the substrate on which the anode is formed. Any method depending on the material may be used for forming the layer. For example, a spin coat method is employed for the polymer materials, while the layer is deposited by sputtering when the material is an insulative oxide.

The layer obtained is patterned by, for example, photolithography to obtain the bank 4. The bank is not necessarily formed on the entire surface of the substrate, and may be locally formed.

Luminous layers 5a, 5b and 5c are formed on the anodes 3a, 3b and 3c as shown in FIG. 4.

The each of emitting layers 5a, 5b and 5c contains red, green or blue luminescent materials. Examples of the luminescent material include rubrene, octaethyl platinum porphyrin, benzothienylpyridine-acetylacetone-iridium complex, terylene, perynone, Nile red, aluminoquinoline complex, bis (benzoquinolinato)beryllium complex, quinacridone, coumalin, anthracene, diphenyl tetracene, 2-tert-butyl-9,10-di (naphthalen-2-yl), perylene, tetraphenyl anthracene, tetraphenyl butadiene, 9,10-bis(phenylethynyl)anthracene, poly(paraphenylenevinylene), poly(2-methoxy-5-(2'-ethyl-hexoxy)-1,4-phenylenevinylene), poly(3-alkylthiophene), poly(9,9-dialkylfluorene), polyparaphenylene, polycarbonate and polynaphthylvinylene. The luminescent material may be appropriately determined depending on the desired color of emitted light.

The emitting layer 5 can be formed on the entire substrate or on a part of the anode by a vacuum deposition method or ink-jet method. The thickness of the emitting layer 5 may be appropriately determined depending on the mobility of carrier, light transmittance, wavelength of the light and color purity. While a sufficient amount of light emission is not attained when the emitting layer is too thin, no special effect is not obtained when the emitting layer is formed excessively thick. The function can be exhibited without any problems as long as the emitting layer 5 is formed at a thickness of 0.01 to 2 μm.

The colors of the emitted light from the emitting layers 5a, 5b and 5c may be the same or different from one another. A full color organic EL display device may be obtained when the emitting layers 5a, 5b and 5c have different colors of the emitted light from one another.

As shown in FIG. 5, the emitting layer 5 may be sandwiched between a hole injection/transport layer 9 that injects and transports holes and an electron injection/transport layer 10 that injects and transports electrons. The hole injection/transport layer 9 and electron injection/transport layer 10 are desirably deposited by vacuum deposition.

Examples of the materials of the hole injection/transport layer 9 include composite materials of polyethylene dioxythiophene with polystyrene sulfonic acid; and polymer materials such as polypyrrole, polythiophene and polyvinyl carbazole. Alternatively, the hole injection/transport layer 9 may be formed using compounds such as copper phthalocyanine, 4,4',4"-tris(3-methyl-phenylphenylamino)triphenylamine, tetracyanoxy dimethane, naphthylphenyl benzidine, methylphenylphenyl benzidine, naphthalenediphenylbiphenyl diamine, titanyl phthalocyanine, triphenylamine, tolylamine, diphenylamino benzaldehyde, and diethylaminophenylamine.

The hole injection/transport layer 9 is usually formed with a thickness of about 0.001 to 0.1 μm.

Examples of the materials of the electron injection/transport layer 10 include tris(8-quinolinol)aluminum, benzothiazole zinc, 3,4,9,10-perylenetetracarboxyl-bis-benzimidazole, basocuproin, biphenylphenyl oxadiazole, bisaminophenyl oxadiazole, lithium fluoride, barium, magnesium fluoride, calcium fluoride, strontium fluoride, barium fluoride, aluminum oxide, lithium quinolinol, and basophenanthroline.

The electron injection/transport layer 10 is usually formed with a thickness of about 0.0001 to 0.01 μm.

As shown in FIG. 6, the cathode 6 is formed on the emitting layer 5. The cathode 6 is desirably composed of a material having a small work function in terms of injecting electrons into the emitting layer 5 (optionally into the electron injection/transport layer 10). Specifically, the work function is preferably 3.4 eV or less. Examples of the material available include lithium, sodium, potassium, rubidium, cesium, magnesium, calcium, strontium and barium as well as aluminum, silver, gallium, vanadium, titanium, bismuth, tin, chromium, antimony, copper, cobalt, gold and the like.

The cathode 6 may be formed with a thickness of about 0.01 to 1 μm by vacuum deposition using these materials.

The desiccant layer 8 is selectively provided on the bank 4 on which the cathode 6 is formed. For forming the desiccant layer 8, the emitting layer 5 is protected first by disposing a mask 7 as shown in FIG. 7. The mask 7 used is desirably a metal mask such as stainless steel. The desiccant layer 8 may be deposited by, for example, a vacuum deposition method, sputtering method or EB deposition method. However, the vacuum deposition method is desirable for avoiding the bank 4 from being degraded.

For vacuum deposition, the raw material of the desiccant is stored in a vessel and heated in vacuum. The desiccant layer 8 is selectively deposited by allowing the generated vapor of the material to adhere on a predetermined region. Preferable materials of the desiccant layer 8 are, as described above, those that readily react with oxygen and water such as lithium, sodium, potassium, rubidium, cesium, magnesium, calcium, strontium and barium. Accordingly, metallic magnesium, metallic calcium and metallic barium may be used, for example, as the raw material of the desiccant layer. Examples of the vessel include a crucible or boat made of alumina, tungsten, molybdenum, stainless steel or quartz. Desirably, the above-mentioned elements are contained in the desiccant layer in an amount of at least 50% or more.

While the temperature for heating the vessel is different depending on the raw material of the desiccant stored, it is usually from 50 to 400° C. The degree of vacuum may be in the range of $10^{-6}$ to $10^{-3}$ Pa, and the deposition rate of the desiccant layer 8 is about 0.1 to 50 nm/s.

As shown in FIG. 8, the desiccant layer 8 is selectively formed on the bank 4 on which the cathode 6 is formed. The thickness of the desiccant layer 8 may be appropriately selected depending on the size of the display device, the kind of the desiccant element, drying performance of the desiccant layer 8, the amount of oxygen and water invading from the outside, and the shape and stability of the desiccant layer 8. A thickness of at least 1 μm or more is desirable for permitting the layer to function as the desiccant layer. However, an excessively thick desiccant layer 8 may cause some inconvenience that the thickness of the display device increases, and the desiccant layer is peeled due to incidence of stress. The thickness of the desiccant layer 8 is desirably restricted to about 100 μm at the largest.

Figure 9:
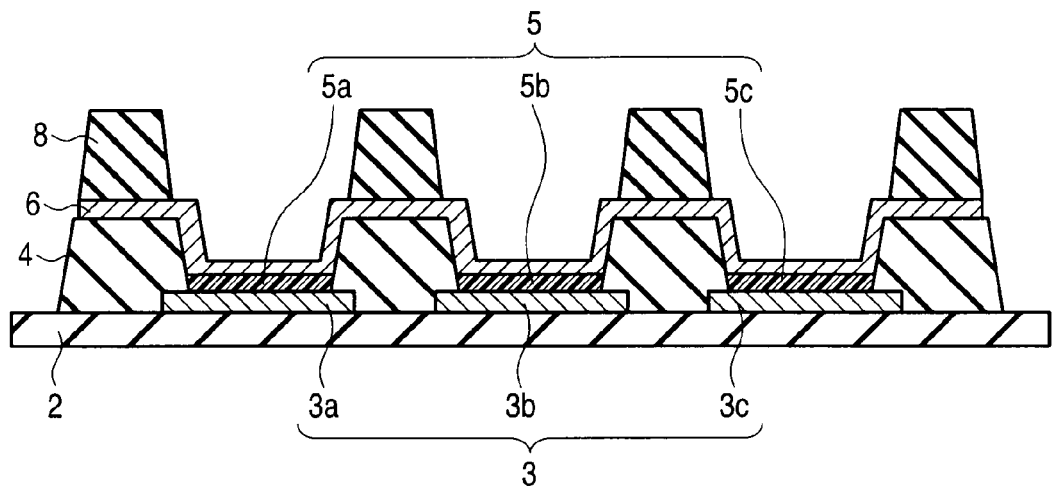
FIG. 9 is a cross-sectional view of the step subsequent to FIG. 8.

A structure in which the desiccant layer 8 is selectively disposed on the bank 4 on which the cathode 6 is formed is obtained as shown in FIG. 9 by removing the mask 7. A layer (not shown) for suppressing oxygen and water from permeating may be provided between the cathode 6 and desiccant layer 8. These layers are deposited by the sputtering method. An example of the material of the layer for suppressing permeation of oxygen and water is silicon oxynitride.

A sealing section 11 is then provided by disposing an adhesive such as epoxy resin around the substrate 2 to provide a sealing substrate 12. The organic EL display device 1 as shown in FIG. 1 is thus formed by allowing the adhesive to cure.

In the embodiment as described above, oxygen and water are absorbed before they approach the luminous region since the desiccant layer is disposed in the vicinity of the luminous region. Since the desiccant layer is formed on the bank that is not related to light emission, a sufficient amount of the desiccant may be disposed. In addition, the desiccant layer is disposed not at one place within the display device but on plurality places of the entire surface within the display device, and is deposited to be swollen, not flat, on the bank. This permits the specific surface area to be remarkably increased as compared with forming the desiccant layer at one site within the display device. Since the desiccant layer has a surface area sufficient for contributing to adsorption of oxygen and water, the drying ability thereof may be sufficiently exhibited.

Examples of the invention will be described below.

EXAMPLE 1

A glass substrate with a thickness of 0.7 mm was prepared as the substrate 2, and an anode 3, which is composed of indium tin oxide with an area of 500 μm² and a thickness of 100 nm, was patterned on the glass substrate as shown in FIG. 2. The distance between adjoining anodes was about 100 μm. The anodes serve as the same color of pixels, and correspond to the first, second and third anodes 3a, 3b and 3c, respectively.

A resin layer for the bank was formed by applying a photosensitive acrylic resin by spin-coating on the substrate 2 on which the anode 3 was patterned. After exposing the bank resin layer pattern-wise so that the periphery of the anode 3 overlaps the bank with a width of about 50 μm, a bank 4 was formed by development.

The substrate on which the bank 4 was formed was placed in a deposition chamber under a vacuum of $10^{-6}$ torr, and a hole injection/transport layer 9 was formed on the exposed anode. Specifically, a copper phthalocyanine film with a thickness of 20 nm was formed, and naphthalene biphenyl-diphenylamine film was formed with a thickness of 40 nm on the copper phthalocyanine film. The vacuum deposition method was employed for film formation. Then, an aluminoquinoline complex as a emitting layer 5 was laminated on the hole injection/transport layer by the vacuum deposition method while the degree of vacuum in the deposition chamber was maintained.

An electron injection/transport layer 10 was formed on the emitting layer 5 by depositing lithium fluoride at a thickness of 0.5 nm by vacuum deposition. Then, aluminum was deposited at a thickness of 20 nm on the entire surface including the electron injection/transport layer 10 and bank 4 to thereby form a cathode 6.

The luminous region including the emitting layer 5 covered with the cathode 6 was protected by a mask 7, and calcium with a thickness of 1 μm was deposited on the bank 4 to form a desiccant layer 8.

A sealing section 11 was provided by applying the photosensitive adhesive around the substrate to bond a sealing substrate 12 thereon. The adhesive was cured by irradiating UV light, and the organic EL display device as shown in FIG. 1 was obtained.

The display device obtained was evaluated by naked eye and microscopic observation. The results showed that no non-luminous sections such as dark spots were formed even after 1 week's lapse of time while light emission was continued. It was thus confirmed that the organic EL display device of the example has long service life while it has a high efficiency.

COMPARATIVE EXAMPLE

The structure shown in FIG. 6 was obtained by forming the anode 3, bank 4, emitting layer 5 and cathode 6 on the substrate 2 by the same procedure as in the example.

Figure 10:
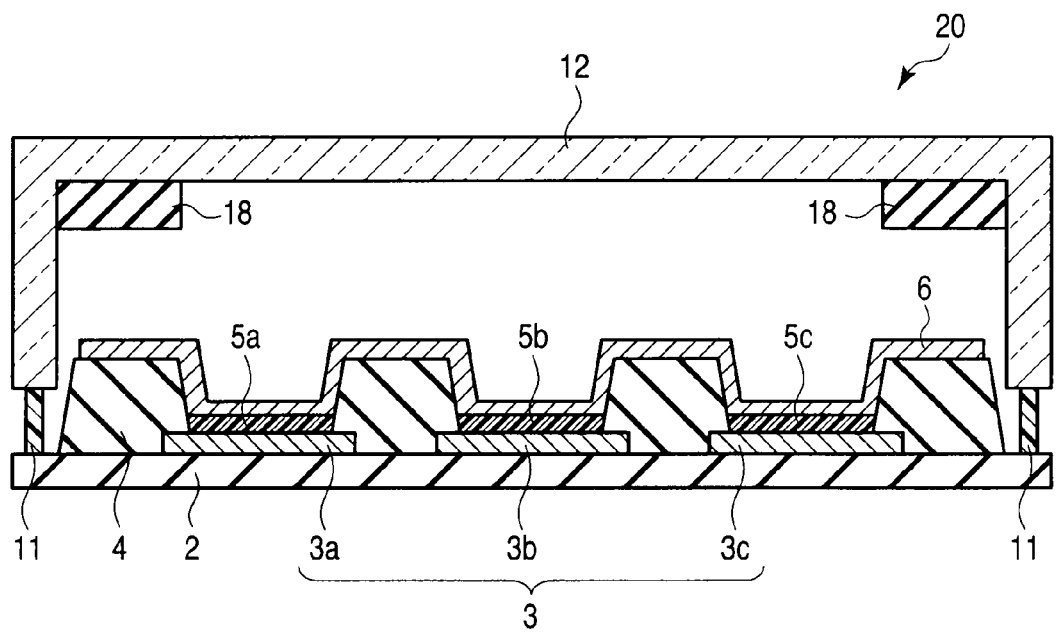
FIG. 10 is a cross-sectional view of an organic EL display device of a comparative example.

A sealing substrate having a recess was prepared, and a desiccant layer 18 made of calcium carbonate was bonded at the periphery of the luminous region. A sealing section 11 was provided by applying a photosensitive adhesive around the substrate 2, and the sealing substrate 12 was bonded and cured with light to manufacture the organic EL display device shown in FIG. 10.

The display device obtained was evaluated as in the example. It was observed that non-luminous sections such as dark spots were formed within several days. The display device of the comparative example was confirmed to have short service life with low efficiency.

According to the embodiment of the present invention, it is there can be presented an organic EL display device having a long service life with high efficiency is provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic electroluminescent display device comprising:
   a substrate having an array of anodes arranged thereon;
   a bank provided between two adjacent anodes, the bank having a top surface;
   an organic emitting layer formed over the anodes;
   a cathode formed over the bank and the organic emitting layer, the cathode having a first region located on the top surface of the bank and a second region located on the organic emitting layer; and
   a desiccant layer formed only on the first region of the cathode such that the second region of the cathode is exposed, the desiccant layer being deposited to be swollen.

2. The device according to claim 1, further comprising a hole injection/transport layer between the anode and the organic emitting layer, and an electron injection/transport layer between the organic emitting layer and the cathode.

3. The device according to claim 1, wherein the desiccant layer comprises at least one selected from the group consisting of alkali metals, alkaline earth metals, alloys comprising an alkali metal and alloys comprising an alkaline earth metal.

4. The device according to claim 1, wherein the desiccant layer comprises at least one selected from the group consisting of lithium, sodium, magnesium, potassium, calcium, rubidium, cesium, strontium and barium.

5. The device according to claim 4, wherein the desiccant layer comprises magnesium.

6. The device according to claim 4, wherein at least 50% or more of the desiccant layer is the elements.

7. The device according to claim 1, wherein the desiccant layer has a thickness of 1 μm or more.

8. The device according to claim 1, wherein the desiccant layer has a thickness of 100 μm or less.

9. The device according to claim 1, further comprising a silicon oxynitride film between the cathode and the desiccant layer.

* * * * *